(12) United States Patent
Rogy et al.

(10) Patent No.: US 8,437,141 B2
(45) Date of Patent: May 7, 2013

(54) DEVICE COMPRISING A SUBSTRATE INCLUDING AN ELECTRONIC CONTACT, AND TRANSPONDER

(75) Inventors: Reinhard Rogy, Graz (AT); Cristian Zenz, Graz (AT)

(73) Assignee: NXP B.V., Eindhoven (NL)

( * ) Notice: Subject to any disclaimer, the term of this patent is extended or adjusted under 35 U.S.C. 154(b) by 722 days.

(21) Appl. No.: 12/095,138

(22) PCT Filed: Nov. 23, 2006

(86) PCT No.: PCT/IB2006/054407
§ 371 (c)(1),
(2), (4) Date: May 28, 2008

(87) PCT Pub. No.: WO2007/060630
PCT Pub. Date: May 31, 2007

(65) Prior Publication Data
US 2008/0308310 A1    Dec. 18, 2008

(30) Foreign Application Priority Data
Nov. 28, 2005  (EP) .................................... 05111387

(51) Int. Cl.
*H05K 7/00*  (2006.01)
(52) U.S. Cl.
USPC ........... 361/760; 361/673; 361/720; 361/748; 174/260
(58) Field of Classification Search .................... 361/673
See application file for complete search history.

(56) References Cited

U.S. PATENT DOCUMENTS

| | | | |
|---|---|---|---|
| 4,728,751 A * | 3/1988 | Canestaro et al. ............ | 174/261 |
| 5,121,298 A * | 6/1992 | Sarma et al. .................. | 361/774 |
| 6,091,332 A | 7/2000 | Eberhardt et al. | |
| 6,107,920 A | 8/2000 | Eberhardt et al. | |
| 6,172,422 B1 * | 1/2001 | Chigawa et al. .............. | 257/778 |
| 6,404,643 B1 | 6/2002 | Chung | |
| 6,428,189 B1 * | 8/2002 | Hochstein ..................... | 362/373 |
| 6,665,193 B1 * | 12/2003 | Chung et al. .................. | 361/760 |
| 6,853,087 B2 | 2/2005 | Neuhaus et al. | |
| 6,867,983 B2 | 3/2005 | Liu et al. | |
| 2002/0038925 A1 | 4/2002 | Reimer | |
| 2002/0145197 A1* | 10/2002 | Ohta et al. .................... | 257/734 |
| 2004/0026754 A1* | 2/2004 | Liu et al. ....................... | 257/414 |
| 2005/0225222 A1* | 10/2005 | Mazzochette et al. .......... | 313/46 |
| 2007/0251339 A1* | 11/2007 | Wiese et al. ................. | 73/866.1 |

* cited by examiner

*Primary Examiner* — Tuan T Dinh
*Assistant Examiner* — Steven Sawyer

(57) ABSTRACT

The invention relates to a device comprising a first electric contact (8, 98) and a substrate (1, 91). The first electric contact (8, 98) comprises a first area (10, 110) with a first wettability, and the substrate (1, 91) comprises a second area (3) with a second wettability and a third area (2) with a third wettability and being adjacent to the second area (2). The first electric contact (8, 98) is attached on the substrate (1, 91) so that the first area (10, 110) of the first electric contact (8, 98) is adjacent to the second area (3), and the second area (3) is located between the first area (10, 110) and the third area (2). The first and the second wettability are higher than the third wettability. The invention also relates to a transponder (T1, T2, T3) which comprises the substrate (1, 91), an electric device (50, 80) and an antenna (7, 93).

17 Claims, 4 Drawing Sheets

DEVICE COMPRISING A SUBSTRATE INCLUDING AN ELECTRONIC CONTACT, AND TRANSPONDER

FIELD OF THE INVENTION

The invention relates to a device comprising a substrate including an electric contact, and to a transponder.

BACKGROUND OF THE INVENTION

A device comprising a substrate and an electric contact attached on the substrate is used for e.g. a transponder. U.S. Pat. No. 6,867,983 B2 discloses a transponder referred to as radio frequency identification (RFID) transponder used as an RFID tag or label. The tag or label includes a device substrate, on which an antenna with two ends is formed, and a strap substrate. When producing the tag or label, the antenna is first formed on the device substrate and then a conductive adhesive is placed on the antenna ends. The microstructure element is placed in a recess of the strap substrate by means of an FSA process, and leads are plated on the strap substrate. Finally, the strap substrate is mounted on the device substrate, with the leads of the strap substrate being in contact with the antenna ends, thus coupling the antenna with the microstructure element.

OBJECT AND SUMMARY OF THE INVENTION

It is an object of the invention to provide a device comprising a substrate and an electric contact attached thereon, which device allows coupling of the electric contact with an electric device to be attached on the substrate in a simpler manner.

It is a further object of the invention to provide a transponder which can be produced in a simpler and more direct manner.

According to the invention, this object is achieved by means of a device comprising: a first electric contact having a first area with a first wettability and a substrate, which comprises a second area having a second wettability and a third area having a third wettability and being adjacent to the second area. The first contact is attached on the substrate so that the first area of the first electric contact is adjacent to the second area, and the second area is located between the first and the third area. Additionally, the first and the second wettability are higher than the third wettability. The first electric contact may be attached on the substrate by forming the first electric contact on the substrate. The first electric contact may be formed by means of any one of a variety of suitable methods, such as printing of conductive ink, plating, or other methods of selective metal deposition.

The substrate is meant to be used, for example, in conjunction with an electric device, for instance, an integrated circuit, which is to be placed on the substrate and coupled electrically to the first electric contact. The substrate of the inventive device comprises the second and the third area having a different wettability. Thus, the electric device is preferably placed in or on the third area, and the electric contacts with the first electric contact may be achieved by applying a conductive adhesive, such as a conductive glue or conductive solder on the first and the second area. Since the wettability of the third area of the substrate is lower than the wettability of the second and the first area, the conductive glue or conductive solder is likely to spread across the first and the second area without wetting the third area, or at least wetting it to a great extent. In order to improve this effect, the third area may be treated in such a way that it even repels the conductive adhesive. Thus, the inventive device makes it possible to apply the conductive adhesive less precisely on the first and the second area of the substrate, helping to speed up the connection of the electric device to the first electric contact.

The different degrees of wettability of the substrate may be obtained by appropriately structuring the substrate or by means of an appropriate surface treatment. During manufacture of the substrate, the second and the third area of the substrate may be obtained by means of an appropriate surface treatment, such as plasma or corona treatment, imprinting techniques, such as nano-imprinting, by composition of additional material layers, by a sputtering process, a vapor-deposition process, by printing a layer having the respective wettability on the respective area, or applying a layer of silicon. Suitable materials for the substrate include polycarbonate, polyvinyl chloride, polyethylene terephthalate (PET), or even ceramics or paper. Particularly, if the substrate is made of a material having a relatively high wettability, such as PET, then only the third area of the substrate needs to be treated, utilizing, for instance, one of the above-mentioned techniques so that the third area has the third wettability. Since the first electric contact is preferably made of a metallic material, the first area may inherently have a relatively high wettability. Otherwise, the surface of the first electric contact, i.e. the first area has to be treated appropriately.

In a restricted version of the inventive device, the device comprises a second electric contact having a fourth area with a fourth wettability. The substrate further comprises a fifth area having a fifth wettability and being adjacent to the third area, and the second electric contact is attached on the substrate so that the fourth area of the second electric contact is adjacent to the fifth area, and the fifth area is located between the fourth and the third area, and the fourth and the fifth wettability are higher than the third wettability. Particularly, if the conductive adhesive is applied not only on the first and the second area, but also on the fourth and the fifth area, the electric device may automatically be centered, or at least centered to a great extent, by the conductive adhesive when coupling the first and the second electric contact to the electric device. This may relax the production process, resulting in faster production and eventually in saving costs. Although embodiments including up to only two contacts have been presented so far, it will be evident to those skilled in the art that, in principle, the invention also applies to devices with more than two contacts.

The inventive device may be designed in such a way that the third area, i.e. the area in which or on which the electric device may be placed, has a relatively low wettability or, preferably, is even repellent to a conductive adhesive to be applied on the first and the second area. However, the first and the second area have a relatively high wettability, so that they attract the conductive adhesive. A conductive adhesive may be a conductive glue or solder. Thus, if the electric device is placed on the third area, preferably partly overlapping the second area of the substrate but without reaching the first area, i.e. the first electric contact, the conductive adhesive can be applied to the first and the second area with less precision. The reason for this is that the third area repels parts of the conductive adhesive that have been applied to it unintentionally, and the first and the second area are likely to attract this part of the adhesive. In addition to the second and the third area, the substrate of the inventive device preferably comprises the fifth area. The fifth area has a wettability which is higher than that of the third area. Preferably, the fifth area attracts the conductive adhesive and the third area is located between the second and the fifth area. If the electric device is placed on the third area and a conductive adhesive is applied to the first, the second, the fourth and the fifth area, the electric device will be centered automatically, or centered at least to a great extent, by the conductive adhesive. The inventive substrate may have the additional benefit that the electric device does not need to be fixed during hardening or curing of the conductive adhesive. The fourth area, i.e. the second contact, preferably attracts the conductive adhesive.

According to the invention, the object is also achieved by means of a transponder comprising the above-described substrate, an antenna having a first contact end being electrically connected to the first electric contact, and an electric device which has a top surface, a bottom surface and a plurality of side surfaces, wherein the electric device is arranged on said third area of said substrate with its bottom surface, and wherein the electric device comprises device contacts being electrically connected to said first electric contact.

When producing the inventive transponder, the electric device, which may be an integrated circuit, may first be arranged in or on the third area by placing it in or on the third area of the substrate. The conductive adhesive, such as a conductive glue or solder, is then applied on the first and the second area. Since the first and the second area have a higher wettability than the third area, the conductive adhesive is likely to spread across the first and the second area only.

In order to improve a reliable electric contact of the electric device with the conductive adhesive, the surface facing the first area preferably comprises an electric contact. Thus, the conductive adhesive only needs to reach the side surface facing the first area for electrically coupling the electric device with the first electric contact. However, the contacts may also be arranged on the bottom surface or top surface of the electric device.

Particularly, the bottom surface of the electric device may be larger than its top surface. This version of the inventive transponder may improve fixation of the electric device to the substrate because of the form-fit between substrate, electric device and conductive adhesive. An additional adhesive applied to the bottom surface of the electric device can thus be omitted. Moreover, the electric device is forced towards the substrate during assembly because the surface tension and/or the weight of the conductive adhesive acting on the inclined side walls also result in a force component towards the substrate. Finally, the electric device has a reduced tendency of initiating cracks when the device is bent. However, the bottom surface may also have the same size as the top area or may be smaller than the top surface.

The bottom surface of the electric device may be placed in or on the second area, preferably without reaching the first area of the first electric contact; i.e. in addition to being placed on the third area, the electric device may be preferably placed at least partly on the second area without overlapping the first electric contact. This version of the inventive transponder prevents or at least limits unwanted stray capacitance between the first electric contact and the electric device, which otherwise occurs when the electric device is placed directly on the first electric contact.

The antenna may be attached on the substrate, and the first contact end of the antenna represents the first electric contact in a further restricted version of the inventive transponder. Consequently, the first electric contact is part of the antenna.

In another restricted version of the inventive transponder, the substrate is a first substrate and the transponder comprises a second substrate on which the antenna is attached, and the first substrate is mounted on the second substrate. Thus the first substrate, which may be referred to as an interposer, holds the electric device and can be manufactured independently of the rest of the transponder.

If the antenna is attached on the substrate, the inventive transponder may comprise a second electric contact having a fourth area with a fourth wettability, the antenna may have a second contact end represent the second electric contact, the substrate may comprise a fifth area having a fifth wettability and being adjacent to the third area, the second contact may be attached on the substrate so that the fourth area of the second contact is adjacent to the fifth area, and the fifth area is located between the fourth and the third area, and the fourth and the fifth area may have a wettability which is higher than the third wettability. In this version of the inventive transponders, the areas and the antenna may be designed in such a way that the electric device is placed in or on the third area between the two ends of the antenna. Since the third area has a lower wettability than the remaining areas, the conductive adhesive, such as the conductive glue or solder wets, on the one hand, at least to a great extent, only the first, the second, the fourth, and the fifth area, leaving the first area substantially alone. On the other hand, particularly if the electric device is placed at least partly on the second and the fifth area of the substrate, the conductive adhesive will also touch and stick to the side surfaces facing the first and the second antenna end, respectively. Due to the surface tension (and in the case of inclined side walls also the weight) of the conductive adhesive placed on the first, the second, the fourth and the fifth area, the conductive adhesive will center the electric device automatically, or center it at least to a certain extent. This eases the process of manufacturing the inventive transponder, because it relaxes a precise centering of the electric device when assembling the inventive transponder. Additionally, since the electric device is centered automatically, or centered at least to a certain extent, by the conductive adhesive, the electric device does not need to be fixed externally during curing and hardening of the conductive adhesive. The fifth wettability of the fifth area of the substrate may be obtained by means of a surface treatment, imprinting techniques, decomposition process, or printing process.

To avoid or at least reduce unwanted stray capacitance, the electric device preferably does not overlap the first and the fourth area of the antenna ends.

These and other aspects of the invention are apparent from and will be elucidated with reference to the embodiments described hereinafter.

BRIEF DESCRIPTION OF THE DRAWINGS

The invention will be described in greater detail hereinafter, by way of non-limiting examples, with reference to the embodiments shown in the drawings.

DESCRIPTION OF EMBODIMENTS

Figure 1:
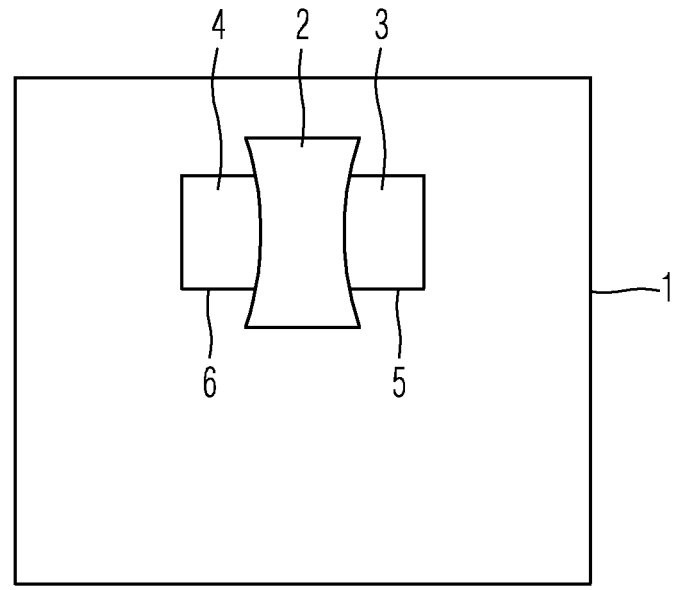
FIG. 1 shows a substrate for a first example of a transponder.
Figure 2:
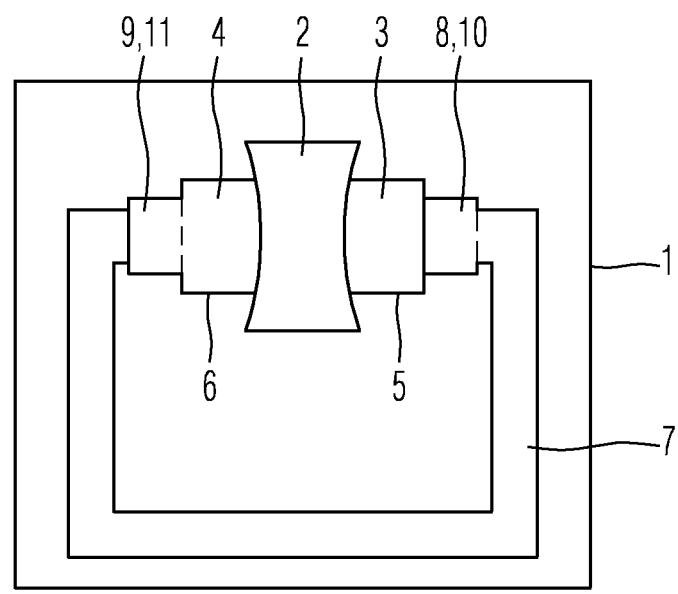
FIGS. 2 to 4 illustrate the process of manufacturing the first transponder.
Figure 3:
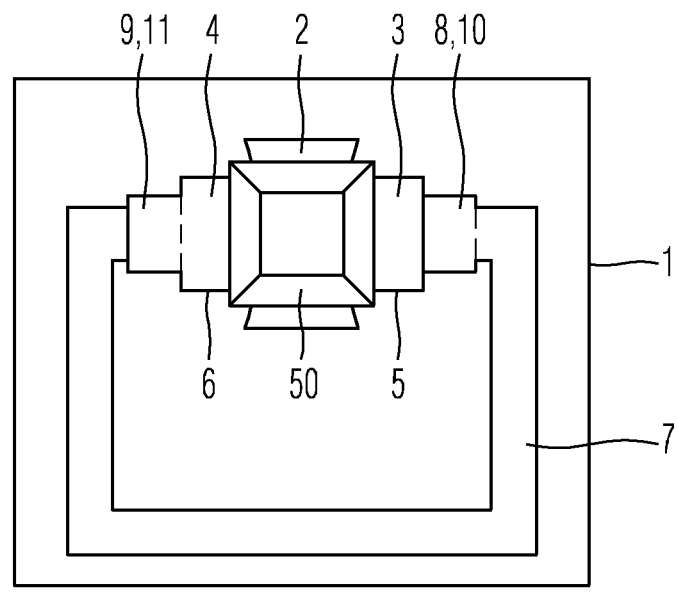
Figure 4:
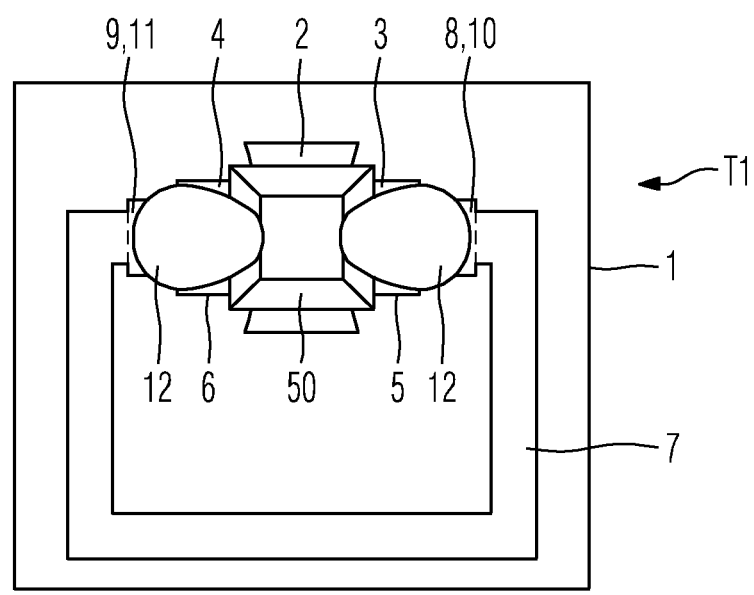
Figure 7:
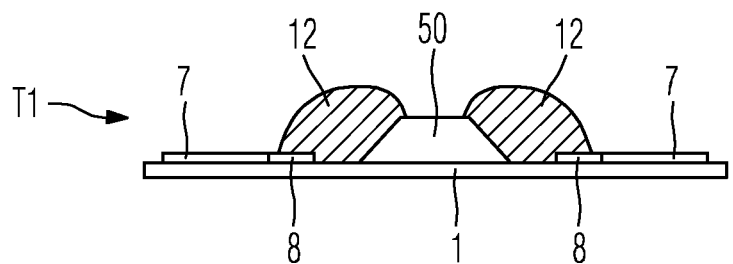
FIG. 7 is a side view of the first transponder.

FIG. 1 is a top view of a substrate 1 used for manufacturing a first example of a transponder T1 whose manufacturing process is illustrated in FIGS. 1 to 4. The transponder T1 is depicted in FIGS. 4 and 7. The substrate 1 is made of polyethylene terephthalate (PET) and the top surface of the substrate 1 has a relatively high wettability so that it attracts a conductive adhesive relatively well, such as a conductive glue or a conductive solder, in the embodiment shown. Reference is made hereinafter to conductive glue. However, solder may be used alternatively for the embodiments of the invention. For manufacturing the transponder T1, the substrate 1 is first structured during a sputtering process. During the sputtering process, an area 2 having a relatively low wettability is formed on the top surface of the substrate 1 so that it repels the afore-mentioned conductive glue. Additionally, further areas 3 and 4 are created on the top surface of the substrate 1. These areas 3, 4 are basically untreated, but are limited by small trenches 5, 6 etched into the top surface of the substrate 1 in the embodiment shown. Consequently, areas 3, 4 have a higher wettability than area 2 and even attract the afore-mentioned conductive glue. The area 2 with the low wettability is adjacent to and located between the areas 3, 4 with the relatively high wettability.

As is shown in FIG. 2, an antenna 7 is formed on the top surface of the structured substrate 1. In this embodiment, the antenna 7 has a first electric contact end 8 and a second electric contact end 9, and the antenna 7 is plated on the top surface of the substrate 1, using a well-known plating process. Each of the two antenna contact ends 8, 9 has an area 10, 11 with a relatively high wettability so that they attract the afore-mentioned conductive glue (normally, the areas 10, 11 coincide with the antenna contact ends 8, 9. However, this is not a mandatory feature of the invention). Furthermore, the area 10 of the first contact end 8 borders the area 3 with the relatively high wettability and is spaced apart from the area 2 with the low wettability. The area 11 of the second contact end 9 borders the area 4 with the relatively high wettability and is spaced apart from the area 2 with the relatively low wettability.

Figure 5:
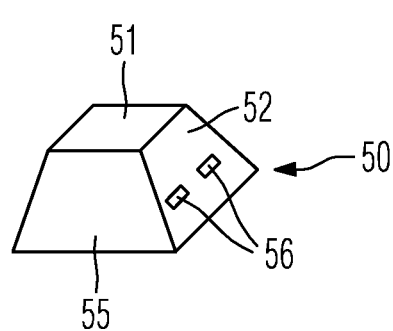
FIGS. 5 and 6 show different sides of an example of an integrated circuit used for the first transponder depicted in FIGS. 2 to 4.
Figure 6:
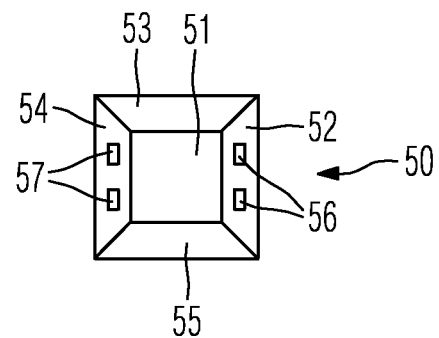

In a subsequent manufacturing step, which is illustrated in FIG. 3, an electric device, which is an integrated circuit 50 in this embodiment, is placed on the area 2 with the relatively low wettability. The integrated circuit 50 is depicted in more detail in FIGS. 5 and 6.

In this embodiment, the integrated circuit 50 has the shape of a frustum of a pyramid and comprises a top surface 51, a first side surface 52, a second side surface 53, a third side surface 54, a fourth side surface 55, and a bottom surface not shown in the Figures. Since the integrated circuit 50 has the shape of a frustum of a pyramid in this embodiment, the side surfaces 52, 53, 54, 55 are inclined with respect to the bottom surface. The first side surface 52 is arranged opposite the second side surface 54. The first side surface 52 comprises first electric contacts 56 and the third side surface 54 comprises second electric contacts 57 for electrically contacting the integrated circuit 50.

The integrated circuit 50 is placed on the area 2 with the relatively low wettability in such a way that the first side surface 52 comprising the first electric contacts 56 faces the first antenna contact 8, and the third side surface 54 comprising the second electric contacts 57 faces the second antenna contact 9. Additionally, the bottom surface of the integrated circuit 50 is dimensioned in such a way that it partly overlaps the two areas 3, 4 with the relatively high wettability when placed on the area 2 with the relatively low wettability, but without reaching the antenna contacts 8, 9.

After placing the integrated circuit 50 on the area 2 with the relatively low wettability and partly on the areas 3, 4 with the relatively high wettability, a conductive glue 12 is applied on the areas 3, 4 with the relatively high wettability and on the antenna contact ends 8, 9 as shown in FIG. 4. Since the area 2 of the substrate 1 has a relatively low wettability and the areas 3, 4 of the substrate 1 as well as the areas 10, 11 of the two antenna contact ends 8, 9 have a relatively high wettability, substantially only the areas 3, 4, 10, 11 are wetted by the conductive glue 12. Moreover, the conductive glue 12 reaches the side surfaces 52 and 54 covering the first and the second electric contact 56, 67 of the integrated circuit 50, thus electrically coupling the integrated circuit 50 to the antenna 7. FIG. 7 is a side view of the transponder T1.

The conductive glue 12 has a certain surface tension and a certain weight. The conductive glue 12 thus substantially centers the integrated circuit 50 between the two antenna contacts 8, 9 while being wet. As a result, the bottom surface of the integrated circuit 50 partly covers the areas 3, 4 with the relatively high wettability but does not reach the two antenna contact ends 10, 11 of the antenna 7. Furthermore, the integrated circuit 50 is forced towards the substrate 1 because the surface tension and/or the weight of the conductive glue 12 acting on the inclined side walls 52, 54 also result in a force component towards the substrate 1.

Figure 8:
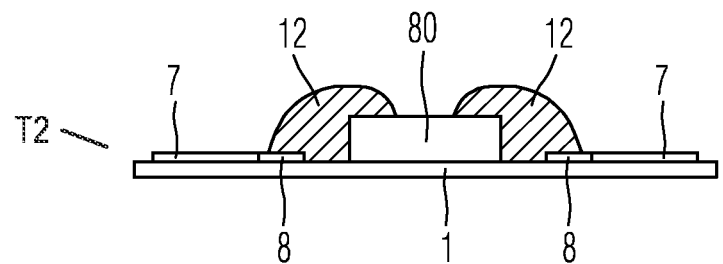
FIG. 8 is a side view of a second example of a transponder.

In the embodiment shown in FIGS. 1 to 7, the integrated circuit 50 of the transponder T1 is shaped as a frustum of a pyramid, wherein its bottom surface is larger than its top surface 51. Such an integrated circuit may also have a top surface which is larger than its bottom surface. Differently shaped integrated circuits may also be used. An embodiment of a transponder T2 having a differently shaped integrated circuit 80 is shown in FIG. 8. The integrated circuit 80 has a rectangular shape.

Figure 9:
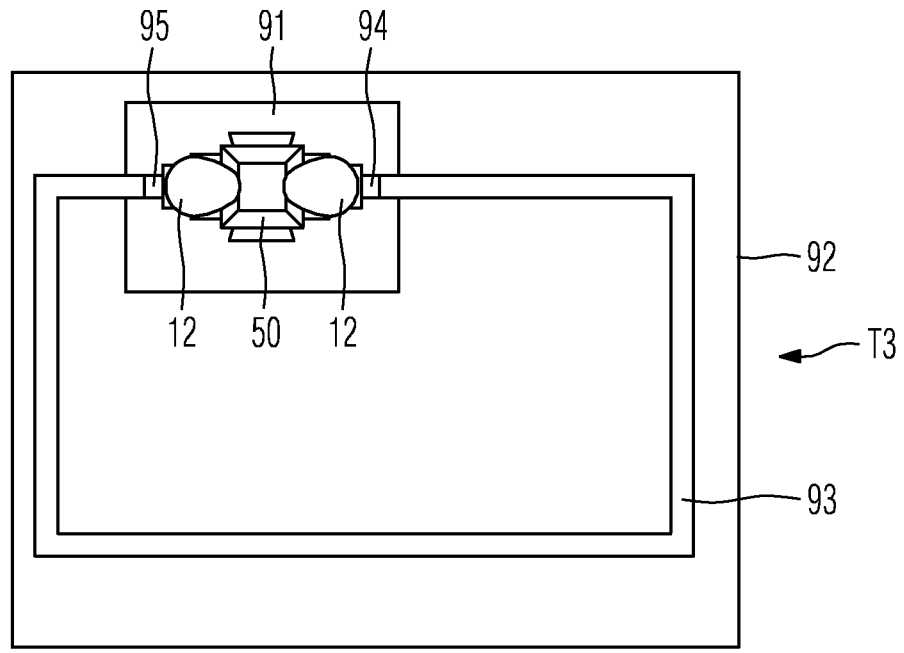
FIGS. 9 and 10 show the steps of manufacturing a third example of a transponder.

FIG. 9 shows a third embodiment of a transponder T3. Components of the transponder T3 that are substantially identical to components of the transponder T1 depicted in FIGS. 1 to 7 have the same reference signs.

The transponder T3 comprises an interposer substrate 91 and a main substrate 92. Both substrates 91 and 92 are made of PET in the embodiment shown. The main substrate 92 is provided with an antenna 93 formed by printing conductive ink on the top surface of the main substrate 92. The antenna 93 has a first contact end 94 and a second contact end 95.

Figure 10:
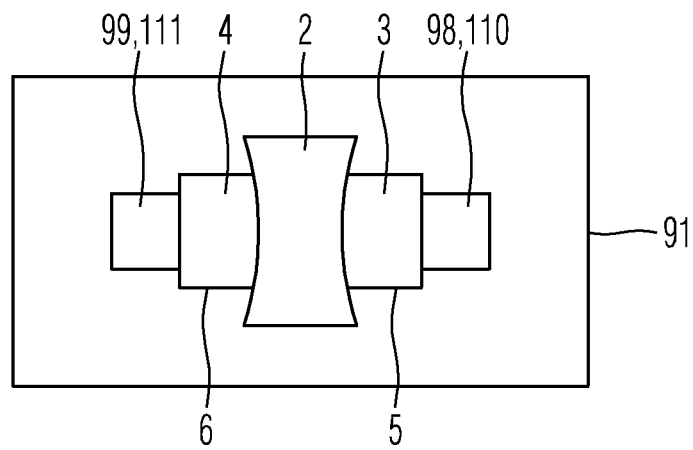

The interposer substrate 91 is shown in more detail in FIG. 10 and has a structure which is similar to that of the substrate 1 of the transponder T1. The interposer substrate 91 thus has an area 2 with a relatively low wettability located between two areas 3, 4 with a relatively high wettability. As is shown in FIG. 10, a first electric contact 98 and a second electric contact 99 are formed on the top surface of the interposer substrate 91, using a well-known plating process. Each of the two contacts 98, 99 has an area 110, 111 with a relatively high wettability so that they attract a conductive glue (normally, the areas 110, 111 coincide with the antenna contact ends 98, 99, which is, however, not a mandatory feature of the invention). Furthermore, the area 110 of the first electric contact 98 borders the area 3 with the relatively high wettability and is spaced apart from the area 2 with the low wettability. The area 111 of the second electric contact 99 borders the area 4 with the relatively high wettability and is spaced apart from the area 2 with the relatively low wettability.

When manufacturing the transponder T3, the integrated circuit 50 is placed on the area 2, and conductive glue 12 is applied to the areas 3, 4, 110, 111 in order to electrically couple the integrated circuit 50 to the electric contacts 98, 99. The interposer substrate 91, including the integrated circuit 50, is then mounted on the main substrate 92, and the first contact end 94 of the antenna 93 is electrically coupled to the first electric contact 98 of the interposer substrate 91. Likewise, the second contact end 95 of the antenna 93 is electrically coupled to the second electric contact 99 of the interposer substrate 91.

It should be noted that the invention applies to transponders having a coil antenna, a dipole antenna, or a monopole antenna, as well as to a transponder having any other antenna. Moreover, the invention is not only applicable to transponders, but also to other electronic devices which are attached to a substrate and preferably have two connectors. Examples are LEDs (active parts), switches (electromechanical parts), resistors, capacitors, and coils (passive parts). It will be evident to those skilled in the art that this is not an exhaustive list, and many other alternatives can easily be found. It should also be noted that the invention also relates to electronic devices having more than one or two connectors, e.g. an amplifier.

Finally, it should be noted that the above-mentioned embodiments illustrate rather than limit the invention, and that those skilled in the art will be capable of designing many alternative embodiments without departing from the scope of the invention as defined in the appended claims. In the claims, any reference signs placed in parentheses shall not be construed as limiting the claims. Use of the verb "comprise" and its conjugations does not exclude the presence of elements or steps other than those stated in any claim or the specification as a whole. The singular reference of an element does not exclude the plural reference of such elements, and vice-versa. In a device claim enumerating several means, several of these means may be embodied by one and the same item of hardware. The mere fact that certain measures are recited in mutually different dependent claims does not indicate that a combination of these measures cannot be used to advantage.

The invention claimed is:

1. A transponder comprising: a first electric contact having a first surface area with a first wettability; a substrate, which comprises a second surface area having a second wettability and a surface structure formed on a third surface area of the substrate and having a third wettability and being adjacent to said second surface area; and
    said first electric contact being attached on said substrate so that said first surface area of said first electric contact is adjacent to said second surface area, and said second surface area is located between said first surface area and said third surface area, said first and said second wettability being higher than said third wettability;
    wherein the wettability of the first, second, and third surface areas represents the degree to which the first, second, and third surface areas attract or repel a conductive glue or a conductive solder;
    an antenna having a first contact end being electrically connected to said first electric contact; and
    an electric device which has a top surface, a bottom surface and a plurality of side surfaces; said electric device being arranged on said surface structure formed on said third surface area of said substrate with its bottom surface and comprising device contacts being electrically connected to said first electric contact; wherein said bottom surface of said electric device partly overlaps said second surface area without reaching said first surface area of said first electric contact.

2. The transponder of claim 1, wherein the surface structure formed on said third surface area is formed by treating said substrate at said third surface area utilizing a sputtering process, a vapor-deposition process, by printing a layer having said third wettability on said third surface area, by applying a layer of silicon, by means of a surface treatment, or by implanting a thin thread or wire.

3. The transponder of claim 1, comprising a second electric contact having a fourth surface area with a fourth wettability; said substrate comprising a fifth surface area having a fifth wettability and being adjacent to said third surface area, and said second electric contact being attached on said substrate so that said fourth surface area of said second electric contact is adjacent to said fifth surface area, and said fifth surface area is located between said fourth surface area and said third surface area, said fourth and said fifth wettability being higher than said third wettability.

4. The transponder of claim 1, wherein said bottom surface of said electric device partly overlaps said second surface area without reaching said first surface area of said first electric contact.

5. The transponder of claim 1, wherein a conductive glue or a conductive solder is applied on said first surface area and said second surface area and forms said electric contact between said first electric contact and said device contacts of said electric device.

6. The transponder of claim 1, wherein one of said side surfaces comprises said device contacts.

7. The transponder of claim 1, wherein said bottom surface is larger than said top surface.

8. The transponder of claim 1, wherein said antenna is attached on said substrate, and said first electric contact end represents said first electric contact.

9. The transponder of claim 1, wherein said substrate is a first substrate, said transponder comprises a second substrate on which said antenna is attached, and said first substrate is mounted on said second substrate.

10. The transponder of claim 1, wherein the substrate is made of a material having the second wettability, wherein only the third surface area of the substrate is treated in order for the third wettability to be lower than the second wettability.

11. The transponder of claim 1, further comprising a conductive glue or conductive solder with which said first surface area and said second surface area are wetted.

12. The transponder of claim 1, wherein the second surface area is defined by trenches etched into the surface of the substrate.

13. The transponder of claim 8, comprising a second electric contact having a fourth surface area with a fourth wettability; said antenna having a second contact end representing said second electric contact, said substrate comprising a fifth surface area having a fifth wettability and being adjacent to said third surface area, and said second electric contact being attached on said substrate so that said fourth surface area of said second electric contact is adjacent to said fifth surface area, and said fifth surface area is located between said fourth surface area and said third surface area, said fourth and said fifth wettability being higher than said third wettability.

14. The transponder of claim 9, comprising a second electric contact having a fourth surface area with a fourth wettability and being attached on said first substrate; said antenna having a second contact end being electrically connected to said second electric contact, said first substrate comprising a fifth surface area having a fifth wettability and being adjacent to said third surface area, and said second electric contact being attached on said first substrate so that said fourth surface area of said second electric contact is adjacent to said fifth surface area, and said fifth surface area is located between said fourth surface area and said third surface area, said fourth and said fifth wettability being higher than said third wettability.

15. A transponder comprising:
- a first electric contact having a first surface area with a first wettability;
- a substrate, which comprises a second surface area having a second wettability and a surface structure formed on a third surface area of the substrate and having a third wettability and being adjacent to said second surface area;
- said first electric contact being attached on said substrate so that said first surface area of said first electric contact is adjacent to said second surface area, and said second surface area is located between said first surface area and said third surface area, said first and said second wettability being higher than said third wettability;
- an antenna having a first contact end being electrically connected to said first electric contact; and
- an electric device which has a top surface, a bottom surface and a plurality of side surfaces; said electric device being arranged on said surface structure formed on said third surface area of said substrate with its bottom surface and comprising device contacts being electrically connected to said first electric contact;
- wherein a conductive glue or a conductive solder is applied on said first surface area and said second surface area and forms said electric contact between said first electric contact and said device contacts of said electric device; and
- wherein the wettability of the first, second, and third surface areas represents the degree to which the first, second, and third surface areas attract or repel the conductive glue or the conductive solder.

16. The transponder of claim 15, wherein said antenna is attached on said substrate, and said first electric contact end represents said first electric contact;
- and further comprising a second electric contact having a fourth surface area with a fourth wettability;
- said antenna having a second contact end representing said second electric contact, said substrate comprising a fifth surface area having a fifth wettability and being adjacent to said third surface area, and said second electric contact being attached on said substrate so that said fourth surface area of said second electric contact is adjacent to said fifth surface area, and said fifth surface area is located between said fourth surface area and said third surface area, said fourth and said fifth wettability being higher than said third wettability;
- wherein a conductive glue or a conductive solder is applied on said fourth surface area and said fifth surface area and forms said electric contact between said second electric contact and said device contacts of said electric device; and
- wherein the wettability of the third, fourth, and fifth surface areas represents the degree to which the third, fourth, and fifth surface areas attract or repel the conductive glue or the conductive solder.

17. The transponder of claim 15, wherein said substrate is a first substrate, said transponder comprises a second substrate on which said antenna is attached, and said first substrate is mounted on said second substrate; and further comprising a second electric contact having a fourth surface area with a fourth wettability and being attached on said first substrate;
- said antenna having a second contact end being electrically connected to said second electric contact, said first substrate comprising a fifth surface area having a fifth wettability and being adjacent to said third surface area, and said second electric contact being attached on said first substrate so that said fourth surface area of said second electric contact is adjacent to said fifth surface area, and said fifth surface area is located between said fourth surface area and said third surface area, said fourth and said fifth wettability being higher than said third wettability;
- wherein a conductive glue or a conductive solder is applied on said fourth surface area and said fifth surface area and forms said electric contact between said second electric contact and said device contacts of said electric device; and
- wherein the wettability of the third, fourth, and fifth surface areas represents the degree to which the third, fourth, and fifth surface areas attract or repel the conductive glue or the conductive solder.

* * * * *